United States Patent
Kim

(10) Patent No.: US 8,976,538 B2
(45) Date of Patent: Mar. 10, 2015

(54) PRINTED CIRCUIT BOARD AND METHOD FOR MANUFACTURING THE SAME

(75) Inventor: Min Sung Kim, Gyunggi-do (KR)

(73) Assignee: Samsung Electro-Mechanics Co., Ltd., Gyunggi-Do (KR)

(*) Notice: Subject to any disclaimer, the term of this patent is extended or adjusted under 35 U.S.C. 154(b) by 48 days.

(21) Appl. No.: 13/605,762

(22) Filed: Sep. 6, 2012

(65) Prior Publication Data

US 2013/0056245 A1 Mar. 7, 2013

(30) Foreign Application Priority Data

Sep. 7, 2011 (KR) .................. 10-2011-0090691

(51) Int. Cl.
*H01R 9/00* (2006.01)
*C25D 5/02* (2006.01)
*H05K 3/10* (2006.01)
*C25D 5/10* (2006.01)
*C23C 18/16* (2006.01)

(52) U.S. Cl.
CPC ................ *C25D 5/022* (2013.01); *H05K 3/108* (2013.01); *C25D 5/10* (2013.01); *C23C 18/1653* (2013.01); *H05K 2203/1476* (2013.01)
USPC ........... 361/774; 361/767; 361/770; 361/771; 361/772; 174/255; 174/256; 174/257; 174/258

(58) Field of Classification Search
CPC ....... H05K 1/0393; H05K 1/111; H05K 3/18; H05K 3/4007; H05K 3/24; H05K 3/4015; H05K 3/4652; H05K 3/243; H05K 3/3436; H01L 24/10; H01L 21/4853; H01L 23/53209; H01L 23/49816; H01L 23/49811; H01L 21/28575

See application file for complete search history.

(56) References Cited

U.S. PATENT DOCUMENTS

| | | | |
|---|---|---|---|
| 5,134,460 A * | 7/1992 | Brady et al. | 257/737 |
| 8,017,436 B1 * | 9/2011 | Huemoeller et al. | 438/107 |
| 2006/0001170 A1 * | 1/2006 | Zhang et al. | 257/762 |
| 2007/0007653 A1 * | 1/2007 | Chen et al. | 257/751 |
| 2009/0188706 A1 * | 7/2009 | Endo | 174/257 |
| 2010/0039211 A1 * | 2/2010 | Wang et al. | 338/204 |
| 2012/0031648 A1 * | 2/2012 | Ebe | 174/250 |

FOREIGN PATENT DOCUMENTS

| | | |
|---|---|---|
| JP | 06-081172 | 3/1994 |
| JP | 07-147476 | 6/1995 |
| JP | 2007-180476 | 7/2007 |
| JP | 2013-058728 | 3/2013 |
| JP | 2013-070043 | 4/2013 |

OTHER PUBLICATIONS

Office action dated Aug. 20, 2013 from corresponding Japanese Patent Application No. 2012-187274 and its English summary provided by the clients.

* cited by examiner

*Primary Examiner* — Tuan T Dinh
*Assistant Examiner* — Steven T Sawyer
(74) *Attorney, Agent, or Firm* — Ladas & Parry, LLP

(57) ABSTRACT

Disclosed herein is a printed circuit board, including a base substrate; and a circuit pattern formed on the base substrate and including a first metal layer having an inclined surface on both upper sides thereof and a second metal layer formed on the inclined part.

5 Claims, 3 Drawing Sheets

PRINTED CIRCUIT BOARD AND METHOD FOR MANUFACTURING THE SAME

CROSS REFERENCE TO RELATED APPLICATION

This application claims the benefit of Korean Patent Application No. 10-2011-0090691, filed on Sep. 7, 2011, entitled "Printed Circuit Board and Method for Manufacturing the Same", which is hereby incorporated by reference in its entirety into this application.

BACKGROUND OF THE INVENTION

1. Technical Field

The present invention relates to a printed circuit board and a method for manufacturing the same.

2. Description of the Related Art

As an electronic device is recently getting smaller and slimmer, a technology of miniaturizing a inclined surface of a circuit pattern of a printed circuit board down to a level of several micrometers has been required.

As a method for miniaturizing a circuit pattern inclined surface of a current printed circuit board, a semi additive process(SAP) has been proposed to be used.

Instead of a substractive process forming a circuit pattern by forming a circuit image on a plated disk, proceeding etching on the circuit image, and removing copper (Cu), the semi additive process(SAP) which forms an image pattern by proceeding a plating resist development on a disk where chemical copper-plated layer is formed, and forms a circuit pattern by proceeding a plating process using a patterned plating resist as a mask.

The semi additive process(SAP) is to obtain a circuit pattern having a vertical step following a plating resist pattern by forming a plating resist pattern having a vertical step first and then implementing electrical copper plating, since a plating resist pattern having a vertical step may be relatively easily realized in a process of forming a plating resist pattern.

However, in the semi additive process(SAP), a plating layer is formed by proceeding copper plating and then, a chemical copper plating layer exposed after the plating resist is removed is removed by performing flash etching or quick etching.

Here, a plating layer which is made of electrolytic copper on a chemical copper plating layer, that is, an upper edge portion of a circuit pattern, is also etched to lead a circuit pattern having a narrow width, such that it is difficult to implement a fine pitch of the pattern.

SUMMARY OF THE INVENTION

The present invention has been made in an effort to provide a printed circuit board where a width of an upper portion of a circuit pattern is not damaged, and a method for manufacturing the same.

Further, the present invention has been made in an effort to provide a printed circuit board which may implement a high-density fine circuit pattern by preventing the width of the upper portion of the circuit pattern from being damaged, and a method for manufacturing the same.

According to a preferred embodiment of the present invention, there is provided a base substrate; and a circuit pattern formed on the base substrate and including a first metal layer having an inclined surface on both upper sides thereof and a second metal layer formed on the inclined surface.

The inclined surface may be downwardly inclined outwardly from an upper surface of the first metal layer.

The second metal layer may be made of a crystal whose etching speed is slower than that of the first metal layer.

The first metal layer and the second metal layer may be electrolytic plating layers.

The printed circuit board may further include an electroless plating layer formed between the base substrate and the first metal layer.

According to another preferred embodiment of the present invention, there is provided a method for manufacturing a printed circuit board, including: preparing a base substrate; forming a plating resist having an opening for forming a circuit pattern on the base substrate; forming a first metal layer having an inclined surface at both upper sides thereof in the opening; forming a second metal layer at an inclined surface of the first metal layer; and removing the plating resist.

In the forming of the first metal layer, the inclined surface may be downwardly inclined outwardly from an upper surface of the first metal layer.

The second metal layer may be made of a crystal whose etching speed is slower than that of the first metal layer.

The forming of the first metal layer and the second metal layer may be performed by electrolytic plating.

The method may further include forming an electroless plating layer on the base substrate, before the forming of the plating resist, and removing the exposed electroless plating layer, after the removing of the plating resist.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
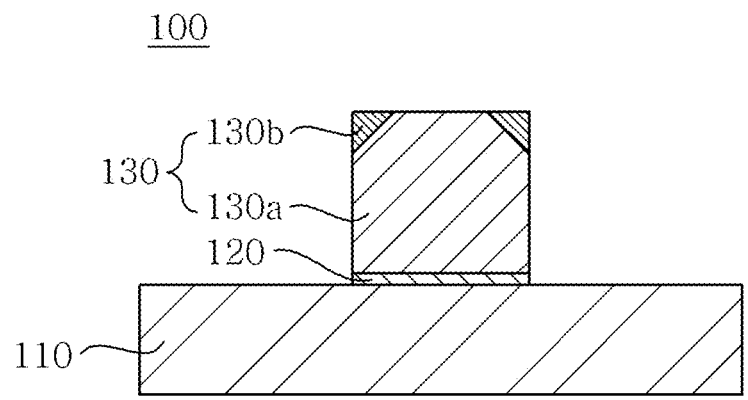
FIG. 1 is a cross-sectional view showing a structure of a printed circuit board according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Printed Circuit Board

FIG. 1 is a cross-sectional diagram depicting a structure of a printed circuit board according to a preferred embodiment of the present invention.

Referring to FIG. 1, a printed circuit board 100 according to a preferred embodiment of the present invention includes a base substrate 110 and a circuit pattern 130 formed on the base substrate 110.

The base substrate 110 is a circuit board where a circuit having one or more layers is formed on an insulation layer, and may be a printed circuit board.

For convenience of explanation, detailed inner-layer circuit configuration is omitted in the drawings; however, those in the art may fully recognize that a general circuit board where a circuit having one or more layers is formed on an insulation layer may be applied as the base substrate 110.

The insulating layer may be made of general resin insulating materials.

As the resin insulating materials, thermosetting resins like epoxy resin such as FR-4, Bismaleimide(BT), Ajinomoto Build up Film (ABF) and so forth, which are considered as a general resin substrate material, thermoplastic resins like polyamide, or resins where a reinforcing material like glass fiber or inorganic filler is impregnated therein, e.g., prepreg, may be used. Furthermore, thermosetting resins and/or UV-curing resins may be used; however, it is not restricted thereto.

The circuit including the circuit pattern 130 may be made of any materials used as a conductive metal for a circuit in a circuit board field, without limitation, and copper may be generally used.

In the preferred embodiment, the circuit pattern 130 may include a first metal layer 130a formed on the base substrate 110 and a second metal layer 130b formed on the first metal layer 130a, as shown in FIG. 1.

The first metal layer 130a may be disposed at a lower portion and the second metal layer 130b may be disposed at an upper portion based on a thickness direction; however, it is not specially restricted thereto and the circuit pattern 130 may be configured of two or more metal layers.

Figure 3:
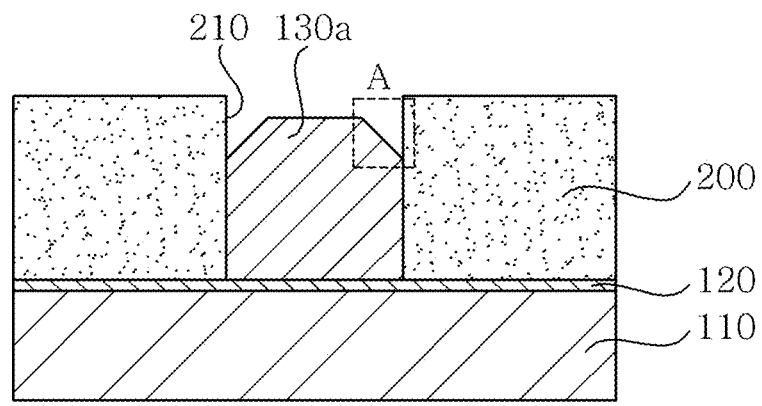

Here, as shown in FIG. 3, the first metal layer 130a may have an inclined part A formed at both upper sides thereof and the inclined part A may be downwardly inclined outwardly from the upper surface of the first metal layer 130a; however it is not restricted thereto.

The second metal layer 130b may be formed on the inclined part A of the first metal layer 130a.

Here, the first metal layer 130a and the second metal layer 130b may be made of any material used as an electric conductive metal, without limitation, for example, metal such as copper (Cu), silver (Ag), or the like.

In addition, the first metal layer 130a and the second metal layer 130b may be electrolytic plating layers formed by electrolytic plating process. The printed circuit board 100 may further include an electroless plating layer 120 formed between the base substrate 110 and the first metal layer 130a.

Here, the electroless plating layer is formed to perform electrolytic plating for forming the circuit pattern 130 in a following-up process.

The second metal layer 130b may be made of crystal whose etching speed is slower than that of the first metal layer 130a.

In the prior art, the first metal layer 130a and the second metal layer 130b are made of a metal layer whose crystalline structure is the same, i.e., a metal layer having the same etching speed, such that the etching speeds thereof in a thickness direction are different from each other.

In other words, since a flow of etching fluid is interfered by a metal layer, pre-reacted etching fluid exists on a bottom of the substrate and the etching fluid is not exchanged with a new etching fluid, whereby an upper portion of the metal layer is significantly etched and a lower portion of the metal layer is relatively insignificantly etched. Accordingly, the circuit pattern 130 has a large side inclination, thereby having a difficulty in implementing a fine circuit.

However, as described above, the second metal layer 130b formed at an upper edge of the first metal layer 130a has a crystal orientation stronger against etching than the first metal layer 130a formed at a lower portion, whereby it is possible to prevent the second metal layer 130b from being etched while the electroless plating layer is etched.

Accordingly, the reduction in upper width of the circuit pattern 130 may be prevented, thereby making it possible to secure insulation distance of the circuit pattern 130 and implement a fine circuit Method for Manufacturing Printed Circuit Board FIGS. 2 through 6 are cross-sectional view showing the processes of a method for manufacturing a printed circuit board according to a preferred embodiment of the present invention.

Figure 2:
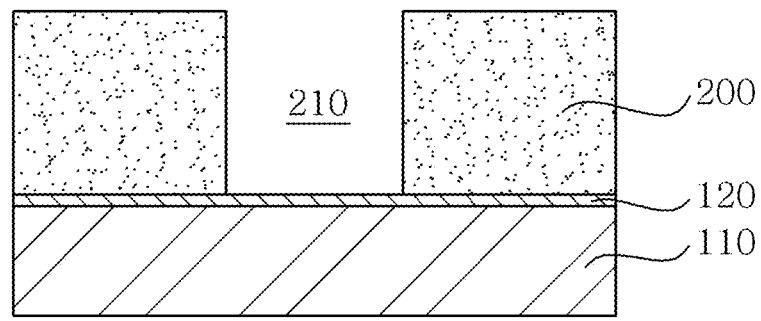
FIGS. 2 through 6 are cross-sectional views showing the processes of a method for manufacturing a printed circuit board according to a preferred embodiment of the present invention.

First, referring to FIG. 2, a base substrate 110 is prepared, and a plating resist 200 having an opening 210 for forming a circuit pattern is formed on the prepared base substrate 110.

The base substrate 110 is a circuit board where a circuit having one or more layers is formed on an insulation layer, and may be a printed circuit board.

For convenience of explanation, detailed inner layer circuit configuration is omitted in the drawings; however, those in the art may fully recognize that a normal circuit board where a circuit having one or more layers is formed on an insulation layer may be applied as the base substrate 110.

The insulating layer may be made of general resin insulating materials.

As the resin insulating materials, thermosetting resins like epoxy resin such as FR-4, Bismaleimide(BT), Ajinomoto Build up Film (ABF) and so forth, which are considered as a general resin substrate material, thermoplastic resins like polyamide, or resins where a reinforcing material like glass fiber or inorganic filler is impregnated therein, e.g., prepreg, may be used. Furthermore, thermosetting resins and/or UV-curing resins may be used; however, it is not restricted thereto.

The circuit including the circuit pattern 130 may be made of any materials used as a conductive metal for a circuit in a circuit board field, without limitation, and copper may be generally used.

The plating resist 200 may be a dry-film (DF); however, it is not specially restricted thereto.

The opening 210 for forming a circuit pattern may be formed in the plating resist 200 according to a method well-known in the art: for example, forming the plating resist 200 on the base substrate 110, disposing a patterned mask(not shown) on the plating resist 200, performing an exposure process thereon to harden the plating resist 200 exposed as patterned portions, removing the mask and performing a next development process to remove non-hardened portions; however, however, it is not specially restricted thereto.

Here, the electroless plating layer 120 may be formed on the base substrate 120 before the plating resist 200 is formed.

The electroless plating layer 120, which is formed for an electrolytic plating process to be performed in a follow-up process, may be formed by a chemical copper plating process or a sputtering process; however, it is not specifically restricted thereto.

Referring to FIG. 3, the first metal layer 130a is formed on the opening 210 for forming a circuit pattern.

In the present embodiment, the first metal layer 130a may be formed through an electrolytic plating process using a plating fluid. As shown in FIG. 3, the first metal layer 130a may have an inclined part A at both upper sides thereof, which may be performed by adjusting contents of additives of the plating fluid used for forming the first metal layer 130a.

Generally, the plating fluid includes additives such as a brightener, a leveler, and a surfactant, and the like, in addition to a plating fluid including a basic metal.

The brightener is an additive for improving gloss by densifying a plating film. The brightener, which is generally a sulfur compound, exists as anions in the plating fluid and serves to interfere with precipitation of metal ions and expedite refinement.

In addition, the leveler is a nitrogen-containing compound like poly-amine. The leveler exists as cations in the plating fluid. The leveler is more absorbed at a place having high current density, and activated overvoltage is increased where the leveler is more absorbed, such that precipitation of copper is suppressed to thereby serve to make the upper surface of the plating layer uniform.

The preferred embodiment of the present invention is not restricted thereto; however, content of the leveler in the plating fluid may be adjusted so as to form the first metal layer 130a having the inclined part A at both upper sides thereof, as shown in FIG. 3.

For example, the first metal layer 130a may be formed using a plating fluid without the leveler or including the leveler of a reference or less.

Figure 4:
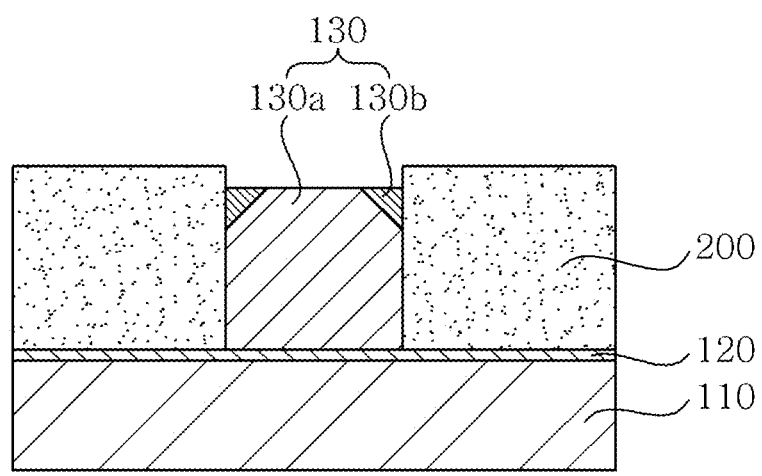

Referring to FIG. 4, the second metal layer 130b is formed at the inclined surface A of the first metal layer 130a.

The second metal layer 130b is not specially restricted thereto. The second metal layer 130b may be formed by performing an electrolytic plating process using plating fluid, and formed on the inclined surface A at both upper sides of the first metal layer 130a to have substantially the same height with the upper surface of the first metal layer 130a.

In the present embodiment, the second metal layer 130b may be made of crystal whose etching speed is slower than that of the first metal layer 130a, which may be performed by adjusting the content of the additives in the plating liquid.

For example, the second metal layer 130b may be formed to have a crystalline structure strong against etching by using a plating fluid without the brightener but including the leveler.

The present embodiment describes a method for adjusting the content of the brightener or the leveler among the additives included in the plating fluid; however, it is no more than one preferred embodiment. A method for adjusting a shape of a plating layer by adjusting a content of an additive and a method for forming a crystalline structure having a different etching speed, well-known in the art, may all be applied.

Figure 5:
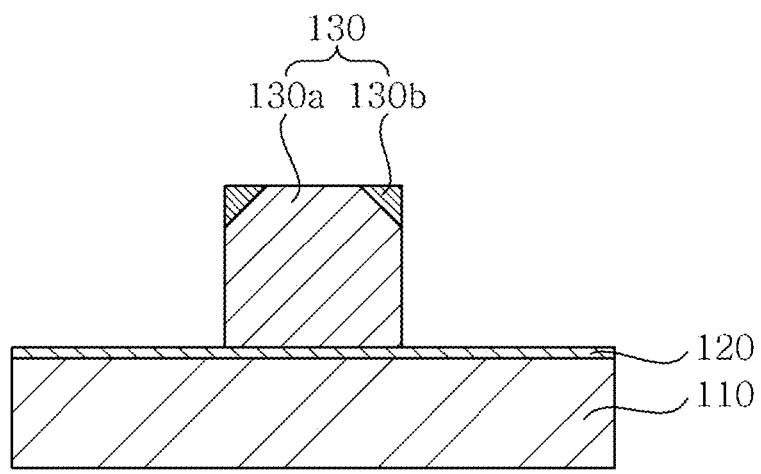

Referring to FIG. 5, the plating resist 200 is removed.

A mechanical delamination or a chemical delamination method may be used so as to remove the plating resist 200; however, it is not specifically restricted thereto.

Figure 6:
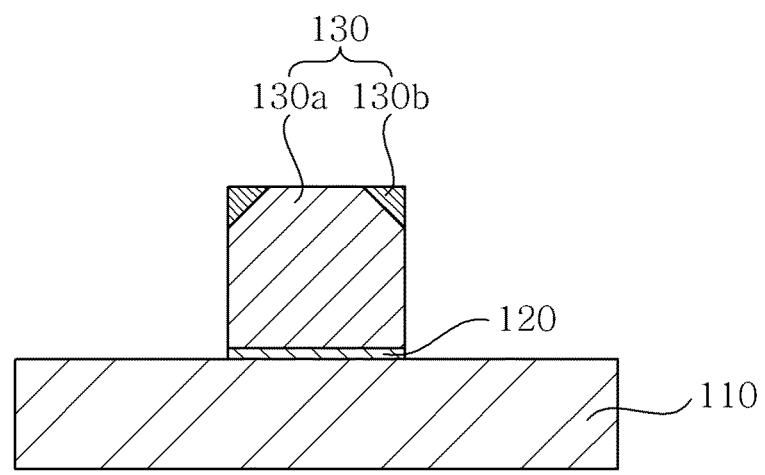

Referring to FIG. 6, the electroless plating layer 120 exposed by removing the plating resist 200 is removed.

Here, the electroless plating layer 120 may be removed by performing quick etching or flash etching.

According to the preferred embodiment of the present invention, the second metal layer 130b is made of a crystal having a slow etching speed, thereby making it possible to prevent the upper sides of the circuit pattern, that is, the second metal layer 130b, from being damaged by an etching liquid, during the etching process for removing the electroless plating layer 120.

Accordingly, the reduction in upper width of the circuit pattern 130 may be prevented, thereby making it possible to secure insulation distance of the circuit pattern 130 and implement a fine circuit pattern.

In addition, although not shown, a protection layer protecting the base substrate 110 and the circuit pattern 130 may also be further formed.

As set forth above, according to the preferred embodiment of the present invention, the plate layer having slow etching speed is formed at the upper sides of the circuit pattern, thereby making it possible to prevent the width of the circuit pattern from being reduced and easily implement a fine circuit.

The circuit pattern having different etching speeds in an inner portion and the outer portion thereof is formed by adjusting the additives of the plating liquid, such that additional materials, processes, facilities, and the like, are not required, thereby making it possible to reduce the manufacturing costs thereof.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A printed circuit board, comprising: a base substrate; a circuit pattern formed on the base substrate and including a first metal layer having an inclined part on both upper sides thereof and a second metal layer formed on the inclined part; and an electroless plating layer formed only between the base substrate and the first metal wherein a width of an upper side of the circuit pattern and a width of a lower side of the circuit pattern are same, the first and second metal layers are made of the same metal layer, which has different crystal structure, and the first and second metal layers are copper layers; wherein the upper side of the first metal layer is exposed.

2. The printed circuit board as set forth in claim 1, wherein the inclined part is downwardly inclined outwardly from an upper surface of the first metal layer.

3. The printed circuit board as set forth in claim 1, wherein the first metal layer and the second metal layer are electrolytic plating layers.

4. The printed circuit board as set forth in claim 1, wherein the upper side of the first metal layer and the upper side of the second metal layer form the same plane.

5. The printed circuit board as set forth in claim 1, wherein the etching speed of the second metal layer is slower than the one of the first metal layer in case of etching with the same etching liquid.

* * * * *